(12) United States Patent
Huang et al.

(10) Patent No.: US 7,742,554 B2
(45) Date of Patent: Jun. 22, 2010

(54) PLL DEVICE WITH LEAKAGE CURRENT COMPENSATION UNIT

(75) Inventors: Chih-Chien Huang, Yunlin Hsien (TW); Chien-Ming Chen, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 969 days.

(21) Appl. No.: 11/456,324

(22) Filed: Jul. 10, 2006

(65) Prior Publication Data

US 2008/0008284 A1    Jan. 10, 2008

(51) Int. Cl.
*H03D 3/24* (2006.01)
(52) U.S. Cl. .................................................. 375/376
(58) Field of Classification Search ................ 375/327, 375/371, 376, 373; 327/156, 159, 172
See application file for complete search history.

(56) References Cited

U.S. PATENT DOCUMENTS 5,892,380 A * 4/1999 Quist ........................ 327/172
6,570,947 B1 * 5/2003 Zipper et al. ............... 375/376
2005/0168292 A1 * 8/2005 Frans et al. .................. 331/16

* cited by examiner

*Primary Examiner*—David C Payne
*Assistant Examiner*—Syed Haider
(74) *Attorney, Agent, or Firm*—Thomas, Kayden, Horstemeyer & Risley (57) ABSTRACT

The invention provides a PLL device comprising a PFD unit, a charging pump circuit, a loop filter, an oscillator, a feedback divider and a current compensation circuit. The PFD unit measures a phase and a frequency difference between a reference clock signal and a feedback clock signal of the PLL device to output a difference signal UP and a difference signal DN. The charging pump circuit receives and transfers the difference signals UP and DN into a current. The loop filter receives and transfers the current into a voltage. The oscillator receives the voltage and outputs an output signal. The feedback divider having a parameter N receives the output signal to generate the feedback clock signal according to the parameter N, wherein a frequency of the feedback clock signal is N times a frequency of the output signal. When the reference clock signal leads the feedback clock signal, the current compensation circuit outputs a compensation current to the loop filter.

28 Claims, 8 Drawing Sheets

PLL DEVICE WITH LEAKAGE CURRENT COMPENSATION UNIT

BACKGROUND OF THE INVENTION

1. Field of the Invention

The present invention relates to a PLL device, and more particularly to a PLL device with a current compensation circuit.

2. Description of the Related Art

Figure 1:
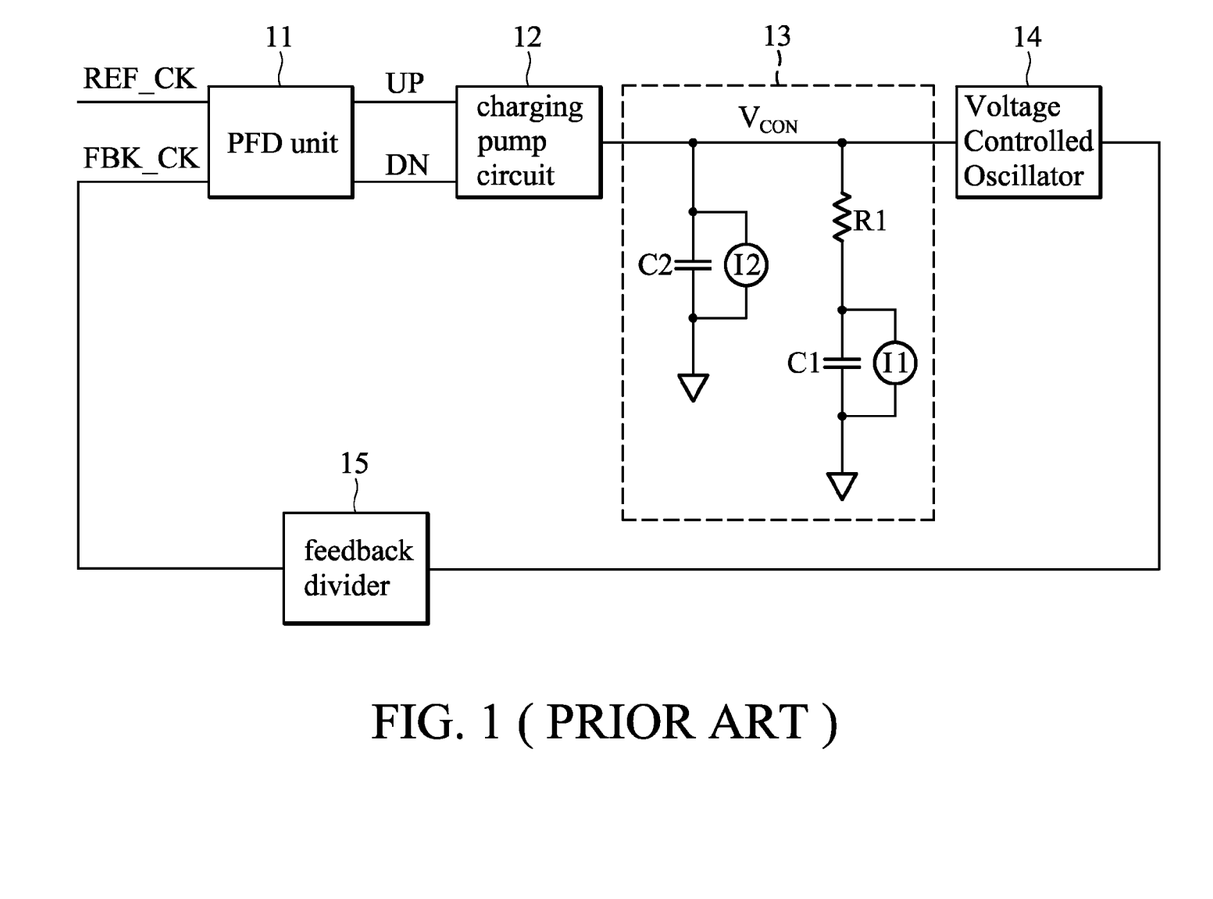
FIG. 1 is a schematic diagram of a conventional PLL device.
Figure 2:
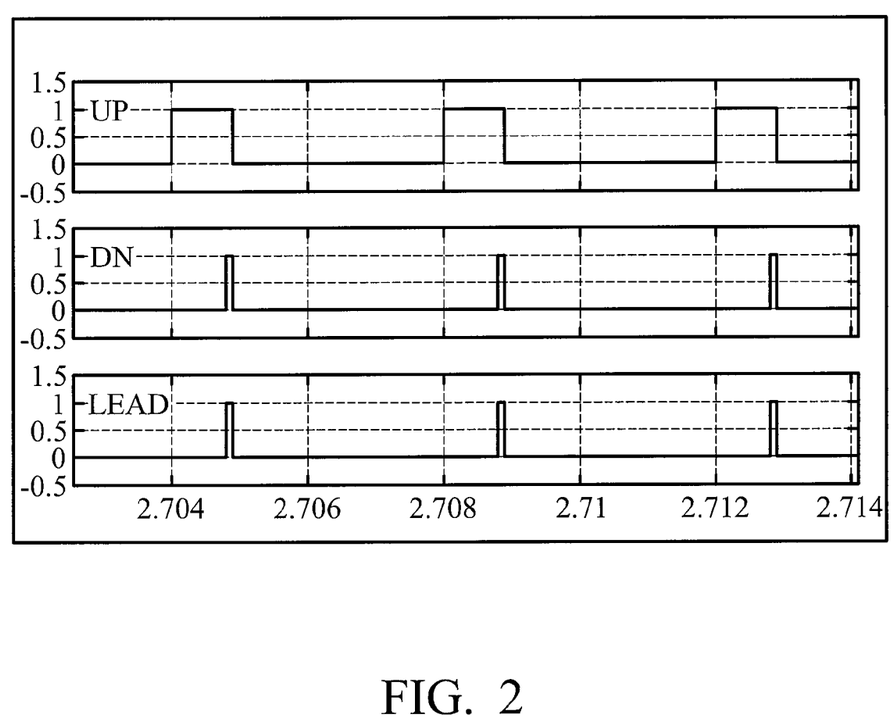
FIG. 2 is a waveform of the phase difference signal UP and phase signal DN of FIG. 1.

The PLL devices have become the major element applying in the frequency generator, wireless receiver, communication device and so on. Please refer to FIG. 1. FIG. 1 is a schematic diagram of a conventional PLL device. PFD unit 11 receives a reference clock signal REF_CK and a feedback clock signal FBK_CK and measures the phase and frequency difference therebetween to output phase difference signals, UP and DN. Charging pump circuit 12 receives and transfers the phase difference signals UP and DN into a current to charge loop filter 13. In FIG. 1, a circuit of a conventional loop filter 13 is provided. The loop filter 13 receives the current from charging pump circuit to limit the rate of change of a capacitor voltage, VCON, resulting in slow rising or falling voltage corresponding to the phase and frequency difference. The voltage controlled oscillator (VCO) 14 generates an output clock signal according to the voltage VCON. Feedback divider 15 has a parameter N to generate the feedback clock signal FBK_CK with wider range frequency, wherein the frequency of the feedback clock signal FBK_CK is N times the frequency of the output clock signal. In an ideal situation, when the PLL is in in-lock state, the phase difference signal UP synchronizes to the phase difference signal DN. If a leakage current is generated in loop filter 13, such as the currents I1 and I2, the charging time of capacitor C2 increases, thus the phase difference signal. UP leads to the phase difference signal DN. Please refer to FIG. 2. FIG. 2 is a waveform of the phase difference signal UP and phase signal DN of FIG. 1. Since a leakage current is generated in the loop filter 13, the charging time of capacitor C2 increases, thus the width of phase difference signal UP is wider than the width of phase difference signal DN, and a phase lead signal LEAD is generated. To optimize the performance of the PLL device, eliminating the generating of phase lead signal LEAD is indeed required. In the semiconductor process, the capacitor C1 and C2 are formed by transistors, if the transistors are formed by 0.18 μm, 0.13 μm or other advanced processes, leakage current may be generated due to the thin gate oxide. However, the thin gate oxide manufactured by the semiconductor process is inevitable, thus a PLL device capable of reducing or eliminating the leakage current of the loop filter thereof is desirable.

BRIEF SUMMARY OF INVENTION

The invention provides a PLL device comprising a PFD unit, a charging pump circuit, a loop filter, a voltage controlled oscillator, a feedback divider and a current compensation circuit. The PFD unit measures a phase and a frequency difference between a reference clock signal and a feedback clock signal of the PLL device to output a difference signal UP and a difference signal DN. The charging pump circuit receives and transfers the difference signals UP and DN into a current. The loop filter receives and transfers the current into a voltage. The voltage controlled oscillator receives the voltage and outputs an output signal. The feedback divider has a parameter N, receives the output signal and generates the feedback clock signal according to the parameter N, wherein a frequency of the feedback clock signal is N times a frequency of the output signal. The current compensation circuit receives the reference clock signal and the feedback clock signal, or the difference signals UP and DN, outputs a compensation current to the loop filter when the reference clock signal leads the feedback clock signal or the difference signal UP leads the difference signal DN.

The invention further provides a current compensation method for a PLL device, comprising the following steps: providing the PLL device having a reference clock signal and a feedback clock signal; providing a current compensation unit; when the current compensation unit receives a phase lock signal from the PLL device, the current compensation unit determines that the reference clock signal leads to the feedback clock signal; when the reference clock signal leads to the feedback clock signal, the current compensation unit outputs a compensation current to the PLL device.

The invention further provides a PLL device comprising a PFD unit, a charging pump circuit, a loop filter, a voltage controlled oscillator, a feedback divider, a phase monitor and a current generator. The PFD unit measures a phase difference and a frequency difference between a reference clock signal and a feedback clock signal of the PLL device to output a difference signal UP and a difference signal DN. The charging pump circuit receives and transfers the difference signals UP and DN into a current. The loop filter receives and transfers the current into a voltage. The voltage controlled oscillator receives the voltage and outputs an output signal. The feedback divider, which has a parameter N, receives the output signal and generates the feedback signal according to the parameter N, wherein a frequency of the feedback signal is N times a frequency of the output signal. The phase monitor outputs a phase lead signal or a phase lag signal. The current generator coupled to the phase monitor has a parameter of a settling time, wherein the current generator detects the phase lead signal at each settling time, and when the current generator receives the phase lead signal, the current generator outputs the compensation current.

A detailed description is given in the following embodiments with reference to the accompanying drawings.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
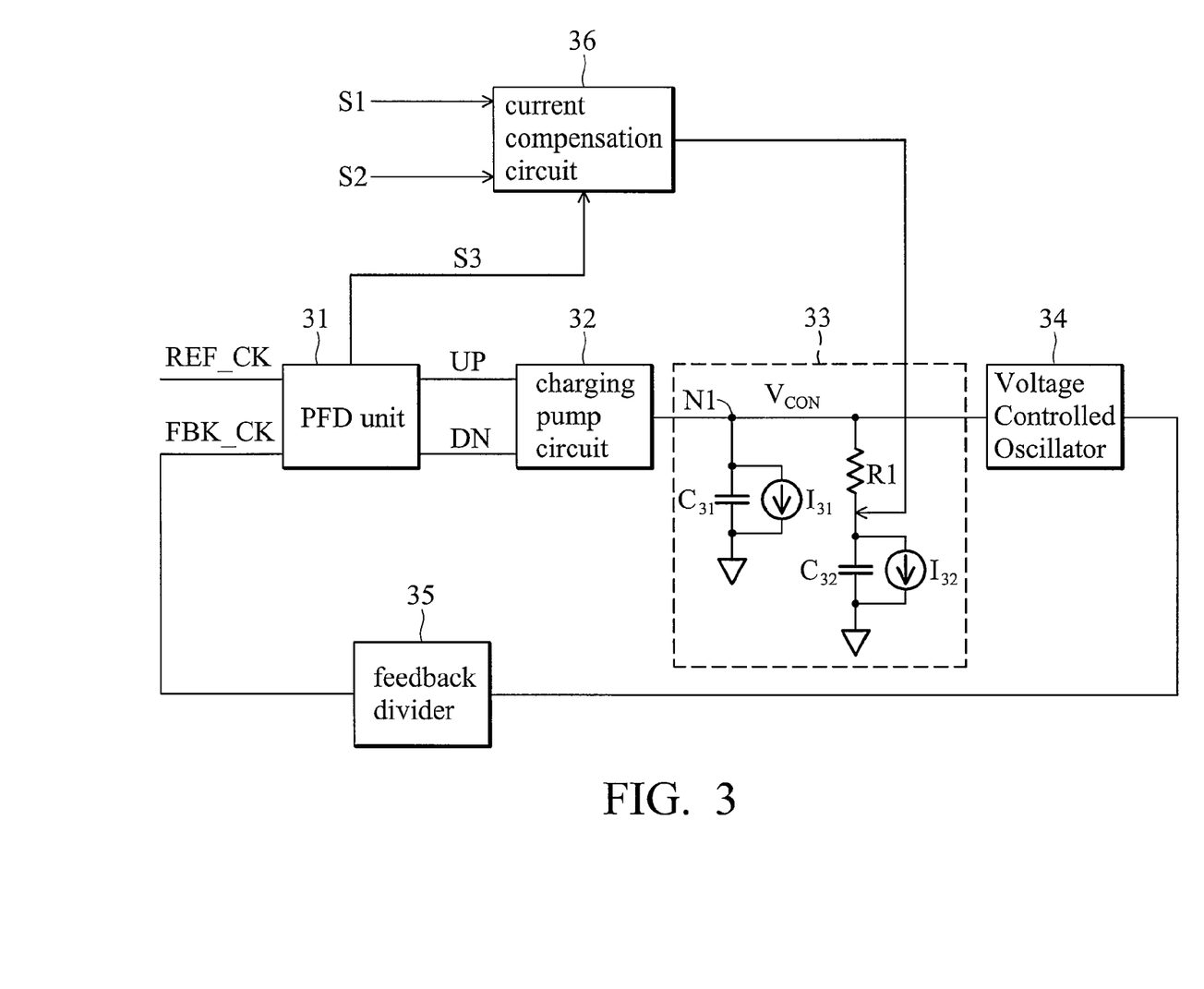
FIG. 3 is a schematic diagram of an embodiment of a PLL device with a current compensation circuit of the invention.

FIG. 3 is a schematic diagram of an embodiment of a PLL device with a current compensation circuit of the invention. PFD unit 31 receives a reference clock signal REF_CLK and a feedback clock signal FBK_CLK and measures the phase and frequency difference therebetween to output phase difference signals, UP and DN. Charging pump circuit 32 receives and transfers the phase difference signals UP and DN into a current to charge loop filter 33. The loop filter 33 comprises a capacitor C31 coupled to the ground and the node N1, a resistor R1 coupled to the node N1 and a capacitor C32 coupled to ground. In this embodiment, the capacitors C31 and C32 are formed by transistor, and the currents $I_{31}$ and $I_{32}$ respectively indicate the leakage current of the capacitors C31 and C32. The voltage controlled oscillator (VCO) 34 generates an output signal according to the control voltage Vcon of node N1. The feedback divider 35 has a parameter N, receives the output signal and generates the feedback clock signal according to the parameter N, wherein a frequency of the feedback clock signal is N times a frequency of the output signal. The current compensation circuit 36 receives two reference signals, S1 and S2, and generates a compensation current to the capacitor C32 to compensate the capacitor C32 for the leakage current $I_{32}$. In one embodiment of the invention, the compensation current is larger than the leakage current $I_{32}$. In another embodiment of the invention, the reference signals S1 and S2 are the reference clock signal REF_CLK and the feedback clock signal FBK_CLK. In yet another embodiment of the invention, the reference signals S1 and S2 are the phase difference signals UP and DN. The current compensation circuit 36 further receives a phase lock signal S3 as a flag signal, such as the phase lead signal LEAD of FIG. 2, indicating the PLL device is in in-lock state. When the PLL device receives the phase lock signal S3, the current compensation circuit 36 detects if the signal S1, such as REF_CLK or UP, leads the signal S2, such as FBK_CLK or DN. If yes, the current compensation circuit 36 outputs a compensation current to the capacitor C32. The frequency of the output signal of VCO 34 then changes following the changing of voltage $V_{CON}$ due to the compensation current. When initial of receiving the compensation current, the voltage $V_{CON}$ jitters acutely, and after a settling time period Ts, the voltage $V_{CON}$ becomes stable, and then the PLL is in in-lock state. The current compensation circuit 36 detects if the signal S1 leads the signal S2. If yes, the current compensation circuit 36 increases the compensation current with a predetermined amount. For example, the first time the current compensation circuit 36 outputs a 5 mA compensation current to the loop filter 33, and when the PLL device is in in-lock state again and there is still a leakage current in the loop filter 33, the current compensation circuit 36 increases 5 mA to the compensation current, thus, the total compensation current is 10 mA. The current compensation circuit 36 continues to increase the compensation current until the signal S1 does not lead the signal S2, and then the current compensation circuit 36 fixes the amount of the output compensation current.

In the embodiment of FIG. 3, the current compensation circuit 36 outputs compensation current when receiving the phase lock signal S3, however, the current compensation circuit 36 also can work appropriately without the phase lock signal S3. The current compensation circuit 36 detects whether the signal S1 leads the signal S2 each settling time period Ts to increase or fix the amount of the compensation current according to the result of the detection. Furthermore, the current compensation circuit 36 also can work even without the parameter, the settling time Ts, thus once the current compensation circuit detects that the signal S1 leads to the signal S2, the current compensation circuit 36 outputs the compensation current. Moreover, the current compensation circuit 36 only receives an input signal, such as the phase lead signal LEAD of FIG. 2, generated by the PFD unit 31 or charging pump circuit 32, and once the current compensation circuit detects that the signal S1 leads to the signal S2, the current compensation circuit 36 outputs the compensation current.

Figure 4:
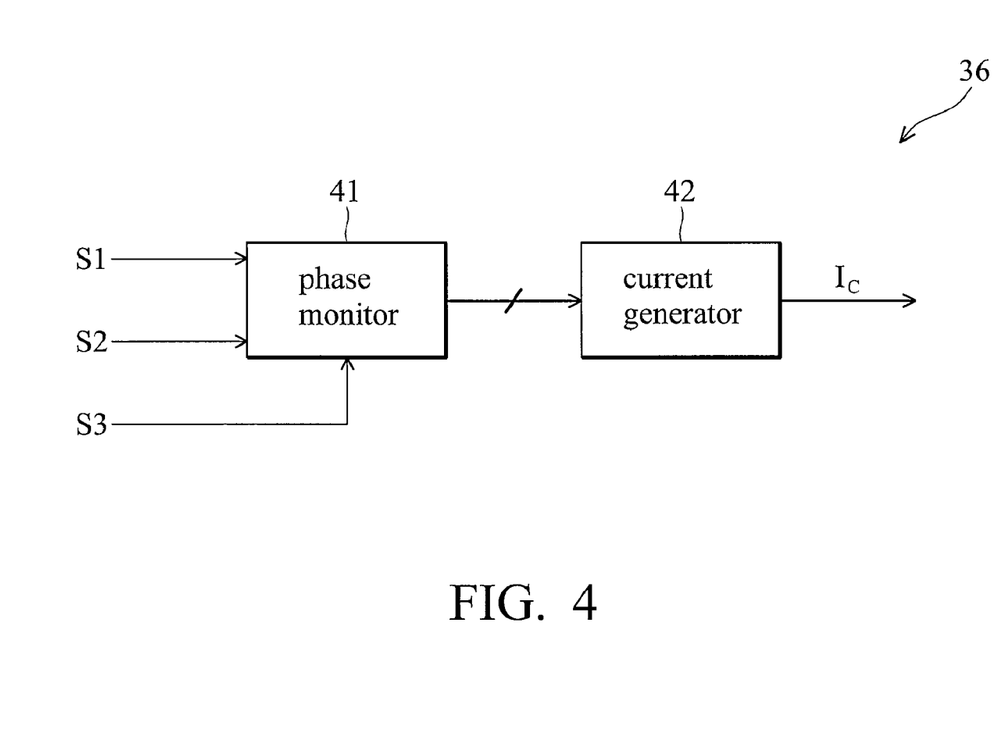
FIG. 4 is a schematic diagram of an embodiment of the current compensation circuit of the FIG. 3 of the invention.

To further illustrate the current compensation circuit 36, please refer to the FIG. 4. FIG. 4 is a schematic diagram of an embodiment of the current compensation circuit of the FIG. 3 of the invention. The current compensation circuit 36 of FIG. 3 comprises a phase monitor 41 and a current generator 42. The phase monitor 41 receives two signals S1 and S2, and determines whether the signal S1 leads the signal S2 when the PLL device is in in-lock state. If the signal S1 leads the signal S2, the phase monitor transmits a control signal to the current generator 42, thus, the current generator 42 outputs a current Ic. The phase monitor determines whether the PLL device is in in-lock state by receiving the phase lock signal S3 or each settling time period Ts. When the phase monitor 41 determines that the signal S1 leads to the signal S2 again, the control signal is transmitted to the current generator 42 again, and then the current generator 42 increases the outputting current Ic. In other words, the amount of the current Ic is determined by the counts of receiving the control signal. When the current generator does not receive the control signal, the current generator does not increase the amount of the output2 current Ic and maintains the amount of the output2 Ic.

Figure 5:
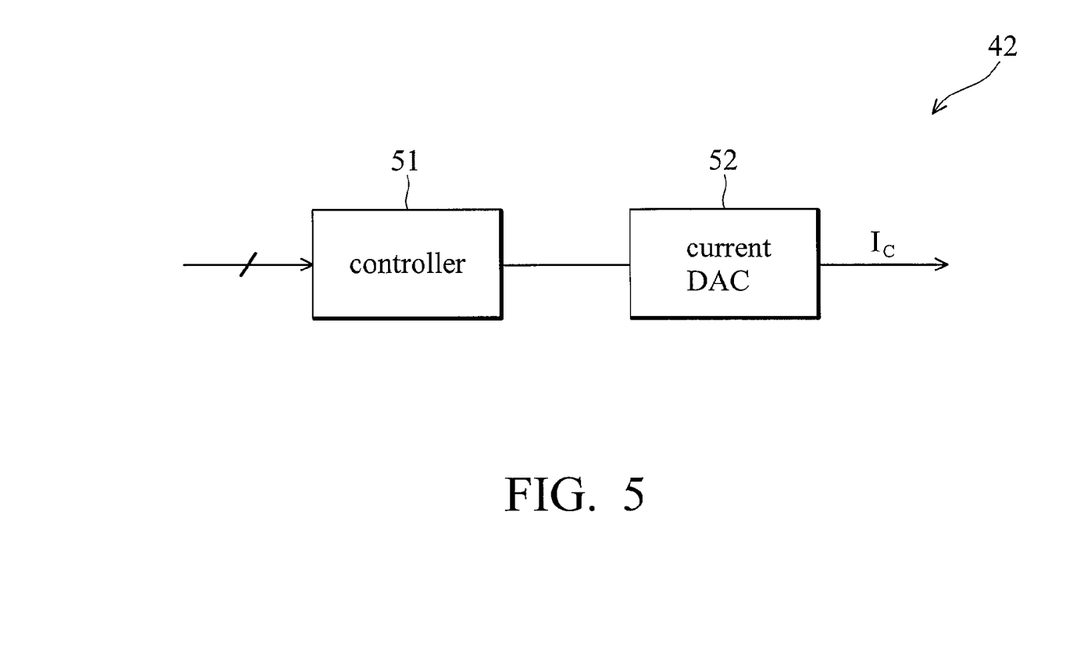
FIG. 5 is a schematic diagram of an embodiment of the current generator of the invention.

FIG. 5 is a schematic diagram of an embodiment of the current generator of the invention. The current generator 42 comprises a controller and a current DAC. The controller receives a phase lead signal, a phase lag signal and a phase lock signal from the phase monitor and transmits a current generating signal to the current DAC when the phase lead signal and the phase lock signal are at high voltage level. The current DAC increases the amount of current until the phase lead signal is at low voltage level.

Figure 6:
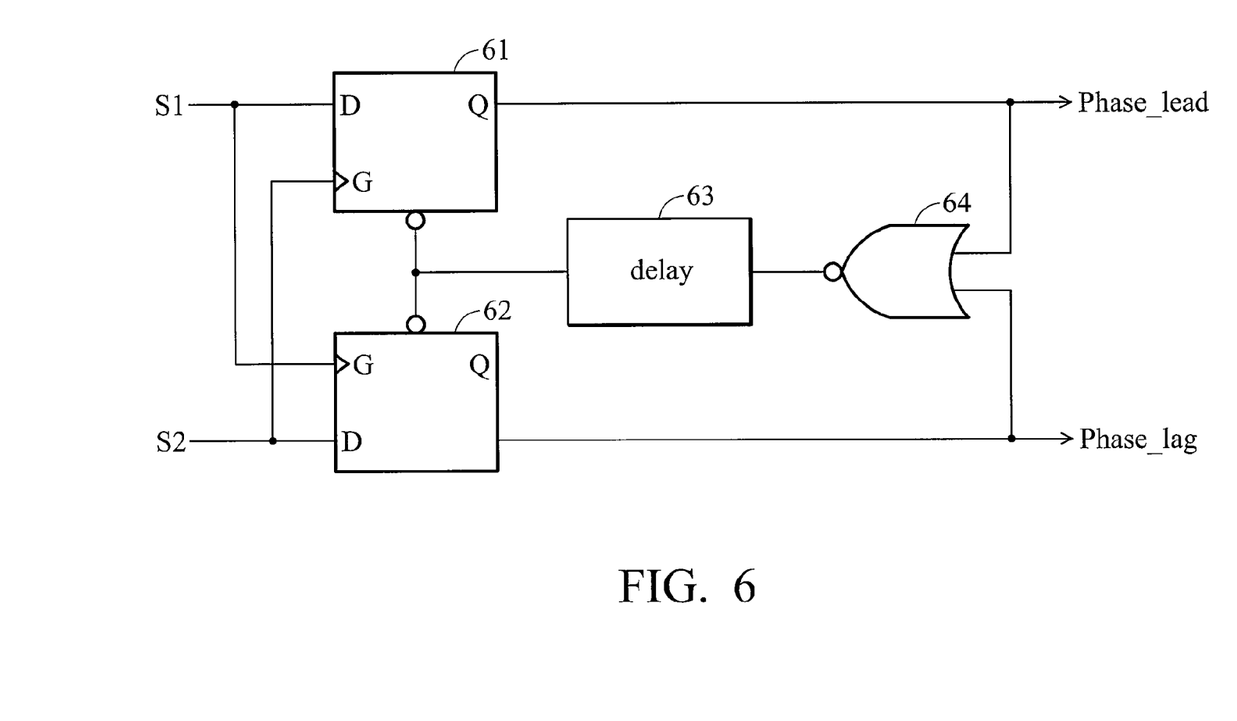
FIG. 6 is a schematic diagram of an embodiment of the phase monitor of FIG. 4 of the invention.

FIG. 6 is a schematic diagram of an embodiment of the phase monitor of FIG. 4 of the invention. The signal S1 is transmitted to the D terminal of the D type flip-flop 61 and the gate terminal of D type flip-flop 62, the signal S2 is transmitted to the D terminal of the D type flip-flop 62 and the gate terminal of D type flip-flop 61, and when the signal S1 leads the signal S2, a phase lead signal Phase_lead is outputted through the Q terminal of the D type flip-flop 61 and when the signal S2 leads the signal S1, a phase lag signal Phase_lag is output through the Q terminal of the D type flip-flop 62. The NOR gate 64 receives the phase lead signal Phase_lead and the phase lag signal Phase_lag, and when the signal S1 synchronizes with the signal S2, the phase lead signal and the phase lag signal are at low voltage level, thus, an enable signal is output to the delay unit 63. The delay unit 63 has a parameter of delay time Td to delay the signals S1 and S2 avoiding the generation of deadzone of signals S1 and S2.

Figure 7:
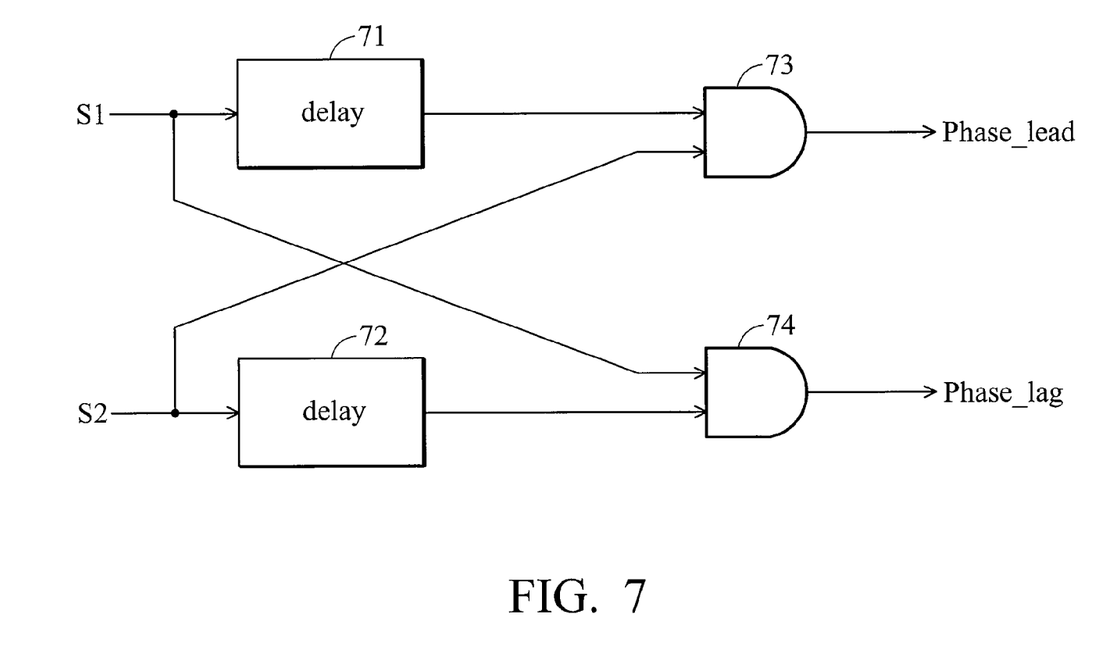
FIG. 7 is a schematic diagram of another embodiment of the phase monitor of FIG. 4 of the invention.
Figure 8:
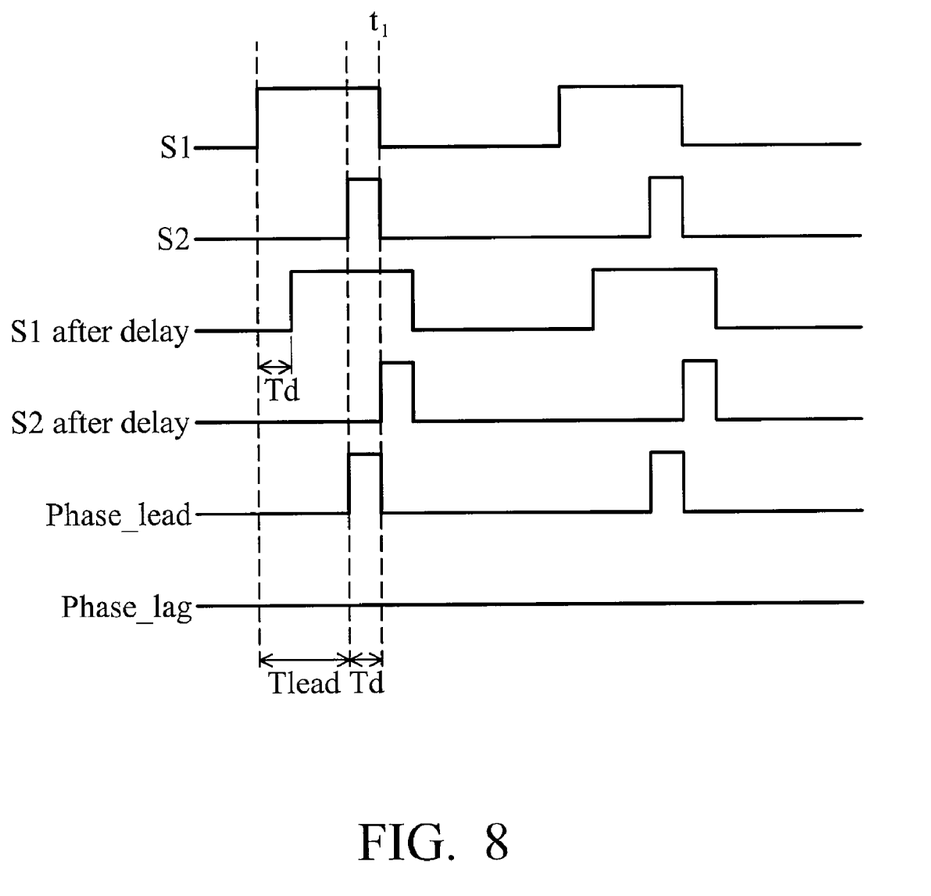
FIG. 8 is a waveform of the phase monitor of FIG. 7.

FIG. 7 is a schematic diagram of another embodiment of the phase monitor of FIG. 4 of the invention. The delay units 71 and 72 have a parameter of delay time Td to delay the signals S1 and S2 avoiding the generation of deadzone of signals S1 and S2. The AND gate 73 receives the signal S2 and delayed signal S1, and the AND gate 74 receives the signal S1 and delayed signal S2. To further illustrate the phase monitor of FIG. 7, please refer to FIG. 8. FIG. 8 is a waveform of the phase monitor of FIG. 7. At time μl, the AND gate 73 receives the delayed signal S1 having logic high level and the signal S2 having the logic level, thus, the signal Phase_lead is at the logic high level. The AND gate 74 receives the delayed signal S2 having logic low level and the signal S1 having the logic level, thus, the signal Phase_lag is at the logic low level. According to the described operation, the phase monitor can determine whether the signal S1 leads the signal S2, and the current generator decides to increase the compensation or not according to the determination of the phase monitor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A PLL device with a leakage current compensation unit, comprising:
   a PFD unit measuring a phase difference and a frequency difference between a reference clock signal and a feedback clock signal of the PLL device to output a difference signal UP and a difference signal DN;
   a charging pump circuit receiving and transferring the difference signals UP and DN into a current;
   a loop filter receiving and transferring the current into a voltage;
   a voltage controlled oscillator receiving the voltage and outputting an output signal;
   a feedback divider having a parameter N, receiving the output signal and generating the feedback clock signal according to the parameter N, wherein a frequency of the feedback clock signal is N times a frequency of the output signal; and
   the current compensation circuit receiving the reference clock signal and the feedback clock signal, or the difference signals UP and DN, determining and outputting a compensation current to the loop filter responsive to the reference clock signal leading the feedback clock signal or the difference signal UP leading the difference signal DN, and fixing the compensation current at a constant level responsive to the reference clock signal synchronizing with the feedback clock signal or the difference signal UP synchronizing with the difference signal DN.

2. The PLL device as claimed in claim 1, wherein when the reference signal synchronizes with the feedback signal, the current compensation circuit stops outputting the compensation current to the loop filter.

3. The PLL device as claimed in claim 1, wherein when the feedback signal leads the reference signal, the current compensation circuit stops outputting the compensation current to the loop filter.

4. The PLL device as claimed in claim 1, wherein the current compensation circuit comprises:
   a phase monitor receiving the first and the second reference signals, outputting a phase lead signal or a phase lag signal; and
   a current generator coupled to the phase monitor, wherein when the current generator receives the phase lead signal, the current generator outputs the compensation current.

5. The PLL device as claimed in claim 4, wherein the phase monitor comprises:
   a first D-type flip-flop having a first input terminal, a second input terminal and a first output terminal outputting the phase lead signal;
   a second D-type flip-flop having a third input terminal, a fourth input terminal and a second output terminal outputting the phase lag signal;
   a time delay unit has two terminals, wherein one of the terminals is coupled to the first D-type flip-flop and the second D-type flip-flop;
   a NOR gate having two input terminals coupled to the phase lead signal and the phase lag signal, and a output terminal coupled to another terminal of the time delay unit; and
   wherein the first reference signals is coupled to the first input terminal and the third input terminal, and the second reference signal is coupled to the second input terminal and the fourth input terminal.

6. The PLL device as claimed in claim 4, wherein the phase monitor comprises:
   a first delay unit providing a delay time for the first reference signals;
   a second delay unit providing the delay time for the second reference signal;
   a first AND gate having two input terminals coupled to the first delay unit and the second reference signal, and a output terminal outputting the phase lead signal; and
   a second AND gate having two input terminals coupled to the second delay unit and the first reference signal, and an output terminal outputting the phase lag signal.

7. The PLL device as claimed in claim 6, wherein the delay time is determined according to a deadzone time of the PFD unit.

8. The PLL device as claimed in claim 6, wherein the current generator outputs the compensation current when it receives a phase lock signal from the PFD unit.

9. The PLL device as claimed in claim 6, wherein the current generator outputs the compensation current after a settling time of the output signal.

10. The PLL device as claimed in claim 4, wherein the current generator comprises:
    a controller outputting a control signal; and
    a current DAC coupled to the controller, wherein when the current DAC receives the control signal, the current DAC outputs the compensation current according to the control signal.

11. The PLL device as claimed in claim 10, wherein the compensation current increases according to the number of times the control signal is received.

12. The PLL device as claimed in claim 1, wherein the loop filter further comprises:
    a first capacitor having two terminals, wherein one terminal is coupled to the ground and another terminal is coupled to the charging pump circuit and the voltage controlled oscillator;
    a resistor having a first terminal and a second terminal, wherein the first terminal is coupled to the charging pump circuit and the 1 voltage controlled oscillator; and
    a second capacitor having two terminals, wherein one terminal is coupled to the ground and another terminal is coupled to the second terminal of the resistor and the current compensation circuit.

13. The PLL device as claimed in claim 12, wherein a capacitance of the first capacitance is larger than a capacitance of the second capacitance.

14. A current compensation method for a PLL device, comprising:
    providing the PLL device having a reference clock signal and a feedback clock signal;
    providing a current compensation unit;

when the current compensation unit receiving a phase lock signal from the PLL device, the current compensation unit determines if the reference clock signal leads to the feedback clock signal;

when the reference clock signal leads to the feedback clock signal, the current compensation unit outputs a compensation current to the PLL device; and when the reference clock signal synchronizes with the feedback clock signal, the current compensation unit fixes the compensation current at a constant level.

15. The method of claim 14, further comprising:
increasing a predetermined amount of the compensation current each time when the current compensation unit determines that the reference clock signal leads to the feedback clock signal.

16. The method of claim 14, further comprising:
when the reference clock signal does not lead to the feedback clock signal, the current compensation unit fixes the compensation current.

17. The method of claim 14, further comprising:
when the reference clock signal does not lead to the feedback clock signal, the current compensation unit stops outputting a compensation current to the PLL device.

18. The method of claim 14, further comprising:
when the feedback clock signal starts leading to the reference clock signal, the current compensation unit stops outputting a compensation current to the PLL device.

19. A PLL device with leakage current compensation unit, comprising:
a PFD unit measuring a phase and a frequency difference between a reference clock signal and a feedback clock signal of the PLL device to output a difference signal UP and a difference signal DN;
a charging pump circuit receiving and transferring the difference signals UP and DN into a current;
a loop filter receiving and transferring the current into a voltage;
a voltage controlled oscillator receiving the voltage and outputting an output signal;
a feedback divider having a parameter N, receiving the output signal and generating the feedback signal according to the parameter N, wherein a frequency of the feedback signal is N times a frequency of the output signal;
a phase monitor outputting a phase lead signal or a phase lag signal; and
a current generator coupled to the phase monitor, having a parameter of a settling time, wherein the current generator detects the phase lead signal every the settling time, and when the current generator receives the phase lead signal, the current generator determines and outputs the compensation current, and when the current generator does not receive the phase lead signal, the current generator fixes the compensation current at a constant level.

20. The PLL device as claimed in claim 19, wherein the phase monitor receives the difference signal DN and the difference signal UP to determine the output signal of the phase monitor, wherein when the difference signal UP leads the difference signal DN, the phase monitor outputs the phase lead signal, and when difference signal DN leads the difference signal UP, the phase monitor outputs the phase lag signal.

21. The PLL device as claimed in claim 19, wherein the phase monitor receives the reference clock signal and the feedback clock signal to determine the output signal of the phase monitor, wherein when the reference clock signal leads the feedback clock signal, the phase monitor outputs the phase lead signal, and when feedback clock signal leads the reference clock signal, the phase monitor outputs the phase lag signal.

22. The PLL device as claimed in claim 19, wherein the phase monitor comprises:
a first D-type flip-flop having a first input terminal, a second input terminal and a first output terminal outputting the phase lead signal;
a second D-type flip-flop having a third input terminal, a fourth input terminal and a second output terminal outputting the phase lag signal;
a time delay unit has two terminals, wherein one of the terminals is coupled to the first D-type flip-flop and the second D-type flip-flop;
a NOR gate having two input terminals coupled to the phase lead signal and the phase lag signal, and a output terminal coupled to another terminal of the time delay unit; and
wherein the first reference signal is coupled to the first input terminal and the third input terminal, and the second reference signal is coupled to the second input terminal and the fourth input terminal.

23. The PLL device as claimed in claim 19, wherein the phase monitor comprises:
a first delay unit providing a delay time for the first reference signals;
a second delay unit providing the delay time for the second reference signal;
a first AND gate having two input terminals coupled to the first delay unit and the second reference signal, and a output terminal outputting the phase lead signal; and
a second AND gate having two input terminals coupled to the second delay unit and the first reference signal, and an output terminal outputting the phase lag signal.

24. The PLL device as claimed in claim 23, wherein the delay time is determined according to a deadzone time of the PFD unit.

25. The PLL device as claimed in claim 19, wherein the current generator comprises:
a controller outputting a control signal; and
a current DAC coupled to the controller, wherein when the current DAC receives the control signal, the current DAC outputs the compensation current according to the control signal.

26. The PLL device as claimed in claim 25 wherein the compensation current increases according to the times of receiving the control signal.

27. The PLL device as claimed in claim 19, wherein the loop filter further comprises:
a first capacitor having two terminals, wherein one terminal is coupled to the ground and another terminal is coupled to the charging pump circuit and the voltage controlled oscillator;
a resistor having a first terminal and a second terminal, wherein the first terminal is coupled to the charging pump circuit and the 1 voltage controlled oscillator; and
a second capacitor having two terminals, wherein one terminal is coupled to the ground and another terminal is coupled to the second terminal of the resistor and the current compensation circuit.

28. The PLL device as claimed in claim 27, wherein a capacitance of the first capacitance is larger than a capacitance of the second capacitance.

* * * * *